(12) United States Patent
Tollot et al.

(10) Patent No.: US 11,874,682 B1
(45) Date of Patent: Jan. 16, 2024

(54) VOLTAGE REGULATOR AND CIRCUITS WITH A VOLTAGE REGULATOR

(71) Applicant: Infineon Technologies AG, Neubiberg (DE)

(72) Inventors: Andrea Tollot, Villach (AT); Thomas Santa, Seeboden (AT); Andrea Bandiziol, Klagenfurt (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 18/062,312

(22) Filed: Dec. 6, 2022

(51) Int. Cl.
*G05F 1/46* (2006.01)
*G05F 3/24* (2006.01)
*H03F 3/45* (2006.01)
*G05F 1/575* (2006.01)

(52) U.S. Cl.
CPC ............... *G05F 3/24* (2013.01); *G05F 1/575* (2013.01); *H03F 3/45475* (2013.01)

(58) Field of Classification Search
CPC ....................................................... G05F 1/618
See application file for complete search history.

(56) References Cited

U.S. PATENT DOCUMENTS

| | | | | |
|---|---|---|---|---|
| 6,232,753 B1* | 5/2001 | Pasotti | ............... | G05F 1/565 323/267 |
| 6,262,938 B1* | 7/2001 | Lee | ............... | G11C 7/1012 365/194 |
| 7,548,471 B2* | 6/2009 | Loeffler | ............... | G11C 7/1051 365/189.08 |
| 2013/0077383 A1* | 3/2013 | Huang | ............... | G11C 13/0004 365/148 |
| 2016/0155512 A1* | 6/2016 | Ogawa | ............... | G11C 7/1039 365/185.18 |

* cited by examiner

*Primary Examiner* — Thomas J. Hiltunen
(74) *Attorney, Agent, or Firm* — Slater Matsil, LLP (57) ABSTRACT

A circuit includes: a first load circuit and a second load circuit coupled in parallel between a first node and a reference voltage node, where the first load circuit and the second load circuit are configured to receive a first input signal and a second input signal, respectively; a first pass device and a first switch coupled in series between a voltage supply node and the first node; a second pass device and a second switch coupled in series between the voltage supply node and the first node; and an amplifier, where a first input terminal and a second input terminal of the amplifier are configured to be coupled to a reference input voltage and the first node, respectively, where an output terminal of the amplifier is coupled to a first control terminal of the first pass device and a second control terminal of the second pass device.

20 Claims, 10 Drawing Sheets

VOLTAGE REGULATOR AND CIRCUITS WITH A VOLTAGE REGULATOR

TECHNICAL FIELD

The present invention relates generally to circuits, and in particular, integrated voltage regulators and circuits with integrated voltage regulators.

BACKGROUND

Circuits and electrical components are designed to work at specific nominal supply voltages (e.g., +3V, +5V, or the like). Variations in the voltages supplied to circuits/electrical components may cause performance degradation or even device failure. Variations in the voltages supplied to circuits/electrical components may be caused by, e.g., change of load conditions caused by the random data patterns in the data lines (or clock lines) of the circuit. For example, when a rising edge or a falling edge occurs in a data line, the data line may draw more current from the power supply, and the increased current load may cause a decrease in the output voltage of the power supply.

Voltage regulators are often used in circuits to reduce the variations in the voltages supplied to circuits/electrical components. Typically, a voltage regulator is designed with a loop bandwidth and is able to compensate for (e.g., track) change in load conditions, when the frequency of change in load conditions is within the loop bandwidth. However, for high-speed data having frequency higher than the loop bandwidth of the voltage regulator, the voltage regulator may not be able to maintain a stable (e.g., substantially constant) output voltage. Increasing the loop bandwidth of the voltage regulator may increase the size and the power consumption of the voltage regulator considerably. Due to the high data rate of modern electronic devices, it may not be possible to design the loop bandwidth of the voltage regulator to match the frequency of the high-speed data. Other existing solutions include a large voltage regulator, which would require a large decoupling capacitor and a large pass device in order to reduce the output impedance of the voltage regulator. Such a solution, however, requires larger area (e.g., higher cost) and higher power consumption. There is a need in the art for voltage regulators that can compensate for high-frequency load changes and provide a stable output voltage.

SUMMARY

In accordance with an embodiment, a circuit includes: a first load circuit coupled between a first node and a reference voltage node, wherein an input terminal of the first load circuit is configured to receive a first input signal; a first pass device and a first switch coupled in series between a voltage supply node and the first node; a second load circuit coupled between the first node and the reference voltage node, wherein an input terminal of the second load circuit is configured to receive a second input signal; a second pass device and a second switch coupled in series between the voltage supply node and the first node; and an amplifier, wherein a first input terminal of the amplifier is configured to be coupled to a reference input voltage, and a second input terminal of the amplifier is coupled to the first node through a feedback network, wherein an output terminal of the amplifier is coupled to a first control terminal of the first pass device and a second control terminal of the second pass device.

In accordance with an embodiment, a circuit includes a voltage regulator that includes: a first transistor and a first switch coupled in series between a voltage supply node and a first node; a second transistor and a second switch coupled in series between the voltage supply node and the first node; and an amplifier, wherein a first input terminal of the amplifier is configured to be coupled to a reference input voltage, and a second input terminal of the amplifier is coupled to the first node through a feedback network, wherein an output terminal of the amplifier is coupled to a first gate terminal of the first transistor and a second gate terminal of the second transistor. The circuit further includes a first load circuit coupled between the first node and a reference voltage node; and a second load circuit coupled between the first node and the reference voltage node, wherein the voltage regulator is configured to, during normal operation of the circuit, open and close the second switch repeatedly in accordance with a load condition of the second load circuit.

In accordance with an embodiment, a method of operating a circuit includes: sending a first input signal to a first load circuit coupled between a first node and a reference voltage node; sending a second input signal to a second load circuit coupled between the first node and the reference voltage node; and powering the first load circuit and the second load circuit by providing a voltage to the first node using a voltage regulator, wherein the voltage regulator comprises: a first transistor and a first switch coupled in series between a voltage supply node and the first node; a second transistor and a second switch coupled in series between the voltage supply node and the first node; and an amplifier, wherein a first input terminal of the amplifier is coupled to a reference input voltage, a second input terminal of the amplifier is coupled to the first node through a feedback network, and an output terminal of the amplifier is coupled to a first gate terminal of the first transistor and a second gate terminal of the second transistor; wherein powering the first load circuit and the second load circuit comprises: keeping the first switch closed to flow a first current through the first transistor into the first node; and closing the second switch to flow a second current through the second transistor into the first node.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EXAMPLES

The making and using of the presently disclosed examples are discussed in detail below. It should be appreciated, however, that the present invention provides many applicable inventive concepts that can be embodied in a wide variety of specific contexts. The specific examples discussed are merely illustrative of specific ways to make and use the invention, and do not limit the scope of the invention. Throughout the discussion herein, unless otherwise specified, the same or similar reference numerals in different figures refer to the same or similar component.

The present disclosure will be described with respect to examples in a specific context, namely deskewing circuit with an integrated voltage regulator. The deskewing circuit is used as a non-limiting example of the various circuits that may use the disclosed integrated voltage regulator. One skilled in the art, upon reading the present disclosure, would be able to readily apply the disclosed integrated voltage regulator in other circuits or other applications.

Digital circuits are widely used in modern electronics systems. In digital circuits, one or more data signals (e.g., digital signals for carrying data) are transmitted on data line(s) (e.g., a data bus) clocked by a respective clock signal. Generally, the digital logic in a digital circuit latches the values of the data signals at the rising edges or falling edges of the clock signal. Therefore, for the digital logic to function properly, the data signals should be synchronized with the clock signal and should remain stable (e.g., unchanged) during the rising edges or falling edges of the clock signal.

Due to various factors in the digital circuits, such as different propagation delays in the transmission paths of the data signals and the clock signal, or voltage variations caused by the random data pattern carried on the data signals, skews (e.g., also referred to as timing skews, or clock skews) may occur between the data signals and the clock signal, and/or among the data signals. The skews may cause functional error of the digital circuit, due to wrong data values being latched at the rising edges or falling edges of the clock signal. Deskewing circuits are used in digital circuits to correct the skews, details of which are discussed hereinafter.

Figure 1A:
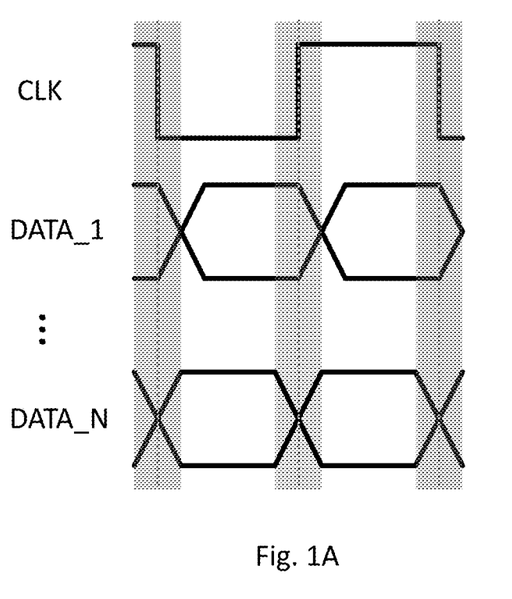
FIG. 1A illustrates timing skews between a clock signal and corresponding data signals, in an embodiment.

FIG. 1A illustrates timing skews between a clock signal and the corresponding data signals clocked by the clock signal, in an embodiment. The dashed vertical lines in FIG. 1A illustrate the rising edges and the falling edges of the clock signal (labeled as CLK). As illustrated in FIG. 1A, at the rising edges or falling edges of the clock signal, the values of the data signals (labeled as DATA_1 to DATA_N) are changing (e.g., transitioning from high to low, or low to high) instead of being stable. In the example of FIG. 1A, there are also timing skews among the data signals such that the data signals change values at different time instants.

Figure 1B:
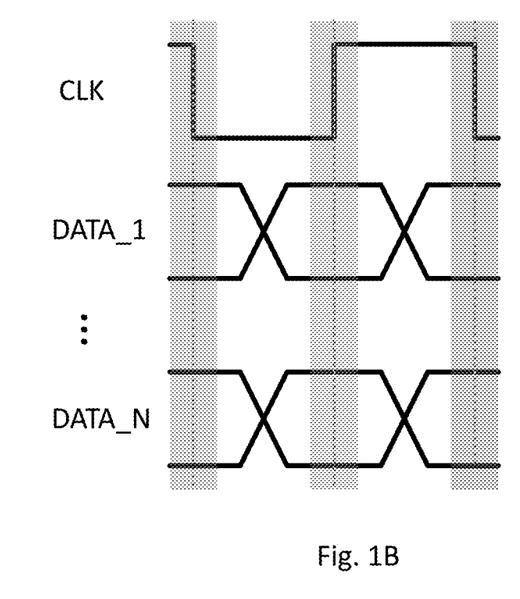
FIG. 1B illustrate the clock signal and the data signals of FIG. 1A, after the timing skews are corrected, in an embodiment.

FIG. 1B illustrate the clock signal and the data signals of FIG. 1A, after the timing skews are corrected by a deskewing circuit, in an embodiment. As illustrated in FIG. 1B, after being deskewed by a deskewing circuit, the data signals are aligned with each other, and remain unchanged during the rising edges and the falling edges of the clock signal. In some embodiments, the deskewing circuit comprises a plurality of programmable delay circuits for delaying each of the clock signal and the data signals by a respective appropriate amount of time, such that after being adjusted (e.g., delayed) by the deskewing circuit, the clock signal and the data signal are aligned as illustrated in FIG. 1B.

Figure 2:
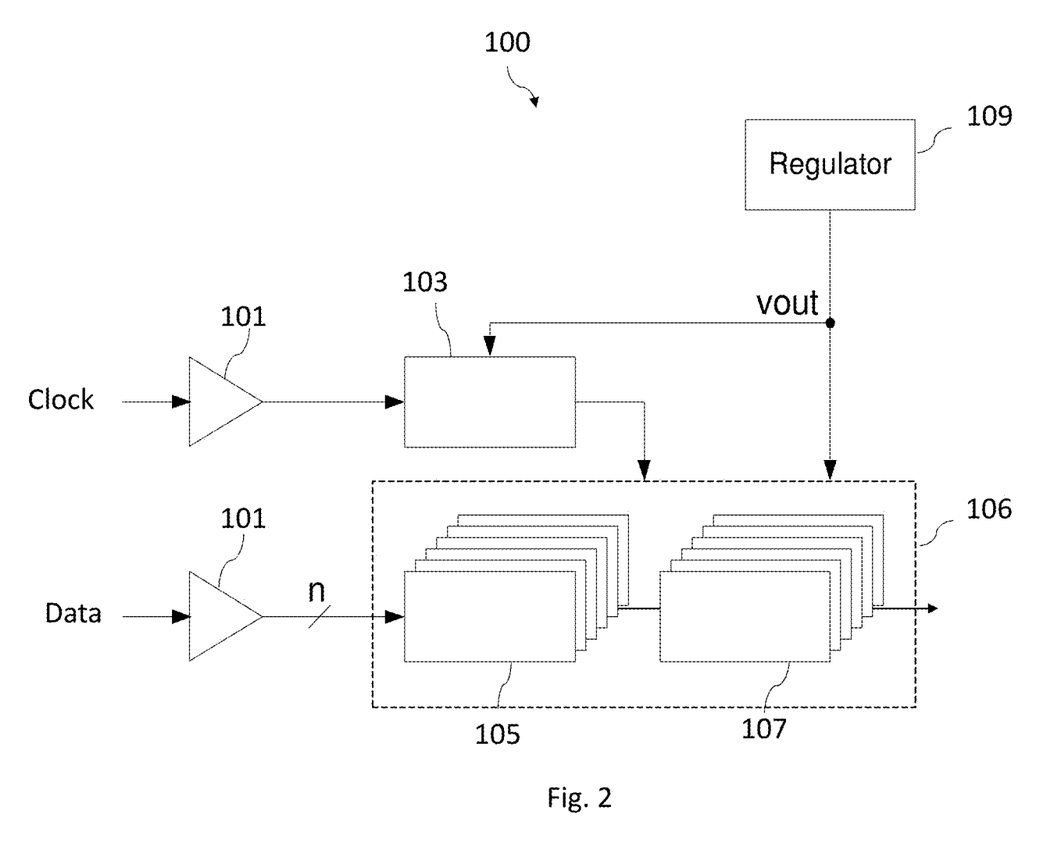
FIG. 2 illustrates a block diagram of an interface circuit with a deskewing function, in an embodiment.

FIG. 2 illustrates a block diagram of an interface circuit 100 with a deskewing function, in an embodiment. For simplicity, not all features of the interface circuit 100 are illustrated. As illustrated in FIG. 2, a clock signal (labeled as Clock) and a plurality of data signals (labeled as Data) are received at input terminals of the interface circuit 100. The clock signal and the data signals are processed by signal conditioning circuits 101, which may perform functions such as converting differential input signals (e.g., the clock signal and the data signals) into single-ended input signals, buffering the input signals, and/or other functions. The clock signal, after being processed by the signal conditioning circuit 101, is delayed by a programmable delay circuit 103. Similarly, each of the data signals, after being processed by a respective signal conditioning circuit 101, is delayed by a respective programmable delay circuit 105. The interface circuit 100 determines the amount of delays for the programmable delay circuits 103/105, such that after being delayed by the programmable delay circuits 103/105, timing skews are removed from the clock signal and the data signal.

FIG. 2 further illustrates a processing block 107 for each of the data signals. The processing block 107 may perform additional data formatting functions, such as a serial-to-parallel conversion for each of the data signals. The programmable delay circuit 105 and the processing block 107 are referred to as the data signal processing block 106. In addition, FIG. 2 illustrates a voltage regulator 109, which provides one or more voltages, such as an output voltage (labeled as Vout) for the programmable delay circuits 103 and 105. Various embodiments of deskewing circuit that could be used in the interface circuit 100 are discussed hereinafter.

Figure 3:
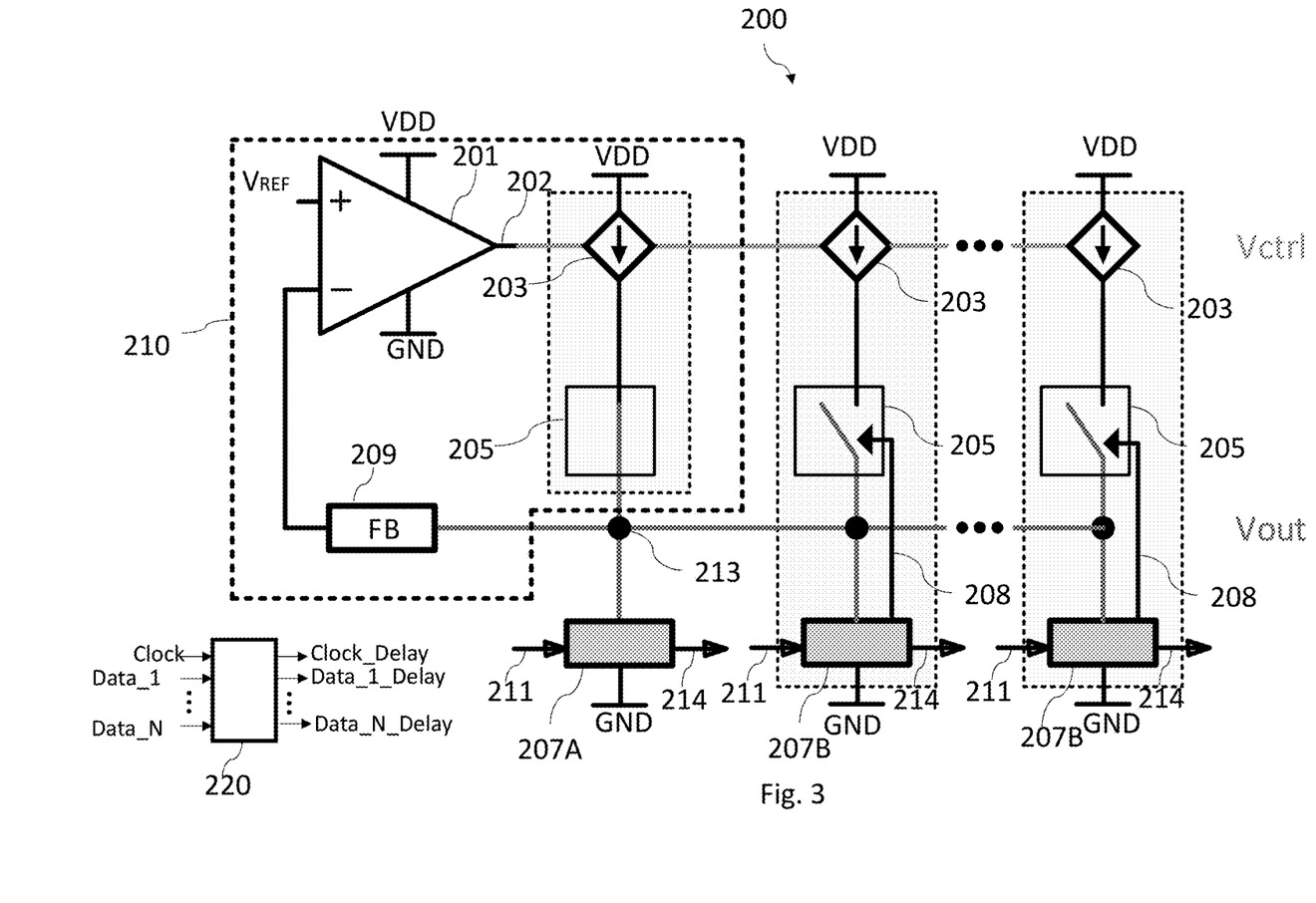
FIG. 3 illustrates a block diagram of a deskewing circuit with an integrated voltage regulator, in an embodiment.

FIG. 3 illustrates a block diagram of a deskewing circuit 200 with an integrated voltage regulator, in an embodiment. The deskewing circuit 200 may be used as part of the interface circuit 100 of FIG. 2.

As illustrated in FIG. 3, the deskewing circuit 200 includes a plurality of programmable delay circuits 207A and 207B (may also be referred to as load circuits). The plurality of programmable delay circuits 207A and 207B may be collectively referred to as programmable delay circuits 207. The programmable delay circuits 207A is used for delaying the clock signal. Each of the programmable delay circuits 207B is used for delaying one of the data signals. In an example embodiment, the programmable delay circuits 207 (e.g., 207A and 207B) for the data signals and the clock signal are the same (e.g., having the same hardware structure), but the delays of the programmable delay circuits 207 may be programmed to apply different delays for the clock signal and the data signals. Each of the programmable delay circuits 207 has an input terminal 211 for accepting an input signal (e.g., the clock signal, or one of the data signals), and has an output terminal 214 for outputting the delayed (e.g., deskewed) input signal. In the example of the FIG. 3, the clock signal and the data signals are single-ended signals, which may correspond to the signals at the output terminals of the signal conditioning circuits 101 of FIG. 2.

In some embodiments, a processing block 220 of the deskewing circuit 200 receives the clock signal (labeled as Clock) and the data signals (labeled as Data_1, . . . , Data_N), and determines (e.g., computes) the appropriate amount of delay (labeled as Clock_Delay) for the clock signal and the appropriate amount of delays (labeled as Data_1_Delay, . . . , Data_N_Delay) for the data signals. The amount of delays determined by the processing block 220 are used to select the delays of the respective programmable delay circuits 207. Details of the programmable delay circuits 207 are discussed hereinafter.

As illustrated in FIG. 3, each of the programmable delay circuits 207 is coupled between a node 213 and a reference voltage node GND (e.g., for connecting to a reference voltage such as electrical ground). A voltage Vout at the node 213 powers (e.g., provides power to) the programmable delay circuits 207. For each of the programmable delay circuits 207, there is a corresponding pair of a pass device 203 and a switch 205 that are coupled in series between a voltage supply node VDD (e.g., for connecting to a voltage supply having a voltage of, e.g., +5V, +3V, or the like) and the node 213. In FIG. 3, each of the programmable delay circuits 207B and its corresponding pair of pass device 203 and switch 205 are illustrated in a same dashed box area. As will be discussed in more details hereinafter, the pair of pass device 203 and switch 205 are used to provide an additional driving current to the respective programmable delay circuits 207B when a rising edge or a falling edge in the data signal is detected.

The pass device 203 may be, e.g., a current source (for providing an electrical current), and may be implemented as a transistor. The switch 205 may be any suitable switch, such as a transistor, a pass gate, or the like. Note that in the illustrated embodiments, during normal operation of the deskewing circuit 200, the switch 205 corresponding to the programmable delay circuits 207A stays closed, while each of the switches 205 corresponding to a respective programmable delay circuits 207B is opened and closed alternately under the control of a control signal 208 generated by the respective programmable delay circuits 207B.

Still referring to FIG. 3, the deskewing circuit 200 includes an amplifier 201. In the illustrated embodiments, the amplifier 201 is an operational amplifier, and therefore, the amplifier 201 is also referred to as operational amplifier 201 in the discussion herein. A positive terminal of the operational amplifier 201 is coupled to a reference voltage Vref, and a negative terminal of the operational amplifier 201 is coupled to the node 213 through a feedback network 209. An output terminal 202 of the operational amplifier 201 is coupled to the control terminals (e.g., gate terminals) of the pass devices 203. During normal operation of the deskewing circuit 200, a control voltage Vctrl is generated at the output terminal 202 of the operational amplifier 201 for controlling the operation of the pass devices 203, and a voltage Vout is generated at the node 213. The voltage Vout is the voltage for powering the programmable delay circuits 207, and therefore, is also referred to as the supply voltage Vout for the programmable delay circuits 207.

In order for the deskewing circuit 200 to function properly, the supply voltage Vout for the programmable delay circuits 207 should be very stable to ensure that the correct delays are generated by the programmable delay circuits 207. Keeping the supply voltage Vout stable may be challenging, because when there is a data transition (e.g., change from zero to one, or one to zero) in the signal (e.g., clock signal or data signal) passing through the programmable delay circuit 207, the programmable delay circuit 207 draws an additional amount of current, which is in addition to the amount of current consumed when there is no transition in the data signal. The additional current drawn may cause a voltage variation (e.g., a voltage drop) in the supply voltage Vout, which in turn results in a voltage variation in the output of the programmable delay circuit 207. The voltage variation in the output of the programmable delay circuit 207 effectively changes the waveform of the output signal (e.g., the deskewed signal) of the programmable delay circuit 207, resulting in an unknow delay (e.g., caused by the random data carried in the data signal). For this reason, the deskewing circuit 200 has an integrated (e.g., built-in) voltage regulator to regulate the supply voltage Vout.

In the illustrated embodiments, the operational amplifier 201, the feedback network 209, the pass devices 203, and the switches 205 form a voltage regulator to regulate the supply voltage Vout. The switch 205 corresponding to a programmable delay circuit 207B is controlled by a control signal 208 generated by the programmable delay circuit 207B. In some embodiments, when a falling edge or a rising edge is detected in the data signal being processed (e.g., delayed) by the programmable delay circuit 207B, the control signal 208 closes the corresponding switch 205 for a period of time (e.g., a pre-determined period of time, see T1 in FIG. 9), such that an electrical current flows from the corresponding pass device 203 (e.g., a current source) into the programmable delay circuit 207B to provide the additional current needed, thereby avoiding or reducing the voltage variation caused by the data transition in the data signal. When there is no data transition (e.g., no rising edge or falling edge detected) in the data signal, the control signal 208 opens the switch 205 corresponding to the programmable delay circuit 207B. In other words, when there is a data transition (e.g., falling edge or rising edge) in the data signal sent to the programmable delay circuit 207B, the switch 205 for the programmable delay circuit 207B is closed by the control signal 208 to provide an on-demand extra current to avoid or reduce voltage variation in the supply voltage Vout, which in turn ensures the accuracy of the delay provided by the programmable delay circuit 207B for deskewing.

Note that the switch 205 corresponding to the programmable delay circuit 207A stays closed during normal operation of the deskewing circuit 200, since the clock signal has a regular pattern (e.g., regularly occurring rising edges and falling edges), and therefore, has a constant or substantially constant average current consumption. By staying closed, the switch 205 corresponding to the programmable delay circuit 207A also closes (e.g., completes) the feedback loop for the operational amplifier 201, such that the control voltage Vctrl and the supply voltage Vout are maintained by the voltage regulator. The circuit 200 of FIG. 3 may be implemented as an integrated circuit (IC) device formed on a semiconductor substrate (e.g., silicon).

Figure 4:
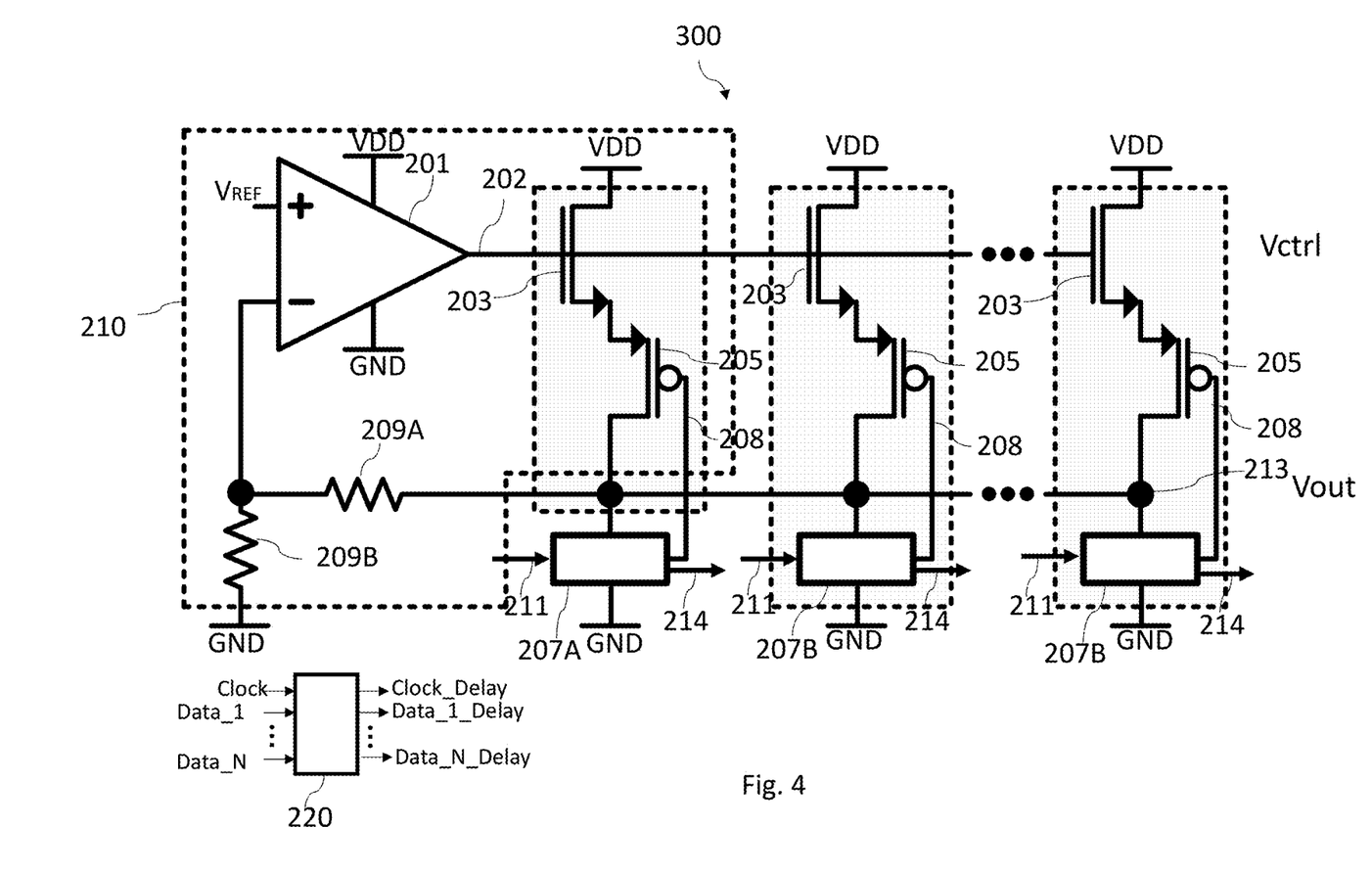
FIG. 4 illustrates a block diagram of a deskewing circuit with an integrated voltage regulator, in another embodiment.

FIG. 4 illustrates a block diagram of a deskewing circuit 300 with an integrated voltage regulator, in another embodiment. The deskewing circuit 300 is similar to the deskewing circuit 200, but with the pass devices 203 and the switches 205 implemented as transistors. In the example of FIG. 4, the pass devices 203 are implemented as an N-type transistors 203 (e.g., NMOS transistors), and the switches 205 are implemented as P-type transistors 205 (e.g., PMOS transistors). In addition, the feedback network 209 of the deskewing circuit 200 is implemented as resistors 209A and 209B in FIG. 4. The deskewing circuit 300 may be considered as an implementation of the more generic design of the deskewing circuit 200. In the discussion hereinafter, the pass device 203 may be referred to interchangeably with transistors 203 and N-type transistors 203, and the switch 205 may be referred to interchangeably with transistors 205 and P-type transistors 205, with the understanding that any suitable devices (e.g., transistors or the like), and any suitable types of devices (e.g., N-type, or P-type), may be used as the pass device 203 and the switch 205.

As illustrated in FIG. 4, the output terminal 202 of the operational amplifier 201 of the deskewing circuit 300 is coupled to the gate terminals of the N-type transistors 203. The control signal 208 are coupled to the gate terminals of the P-type transistors 205. Note that since the switch 205 is implemented as a transistor, closing the switch 205 is achieved by turn on the transistor, and conversely, opening the switch 205 is achieved by turning off the transistor. In some embodiments, when there is a data transition (e.g., rising edge or falling edge) detected in the data signal, the control signal 208 turns on the P-type transistor 205 for a period of time, such that an electrical current flows through the load path terminals (e.g., drain/source terminals) of the N-type transistors 203, through the load path terminals (e.g., drain/source terminals) of the P-type transistors 205, and into the programmable delay circuit 207B. Note that the P-type transistor 205 corresponding to the programmable delay circuit 207A is turned on (e.g., stays in the ON state) in the example of FIG. 4. Operation of the deskewing circuit 300 is the same as or similar to that of the deskewing circuit 200, thus details are not repeated.

In some embodiments, the programmable delay circuit 207 (e.g., 207A and 207B) of the deskewing circuit 200 (or 300) includes a tapped delay line circuit 250 and a control circuit 260, which are discussed below with reference to FIGS. 5 and 6.

Figure 5:
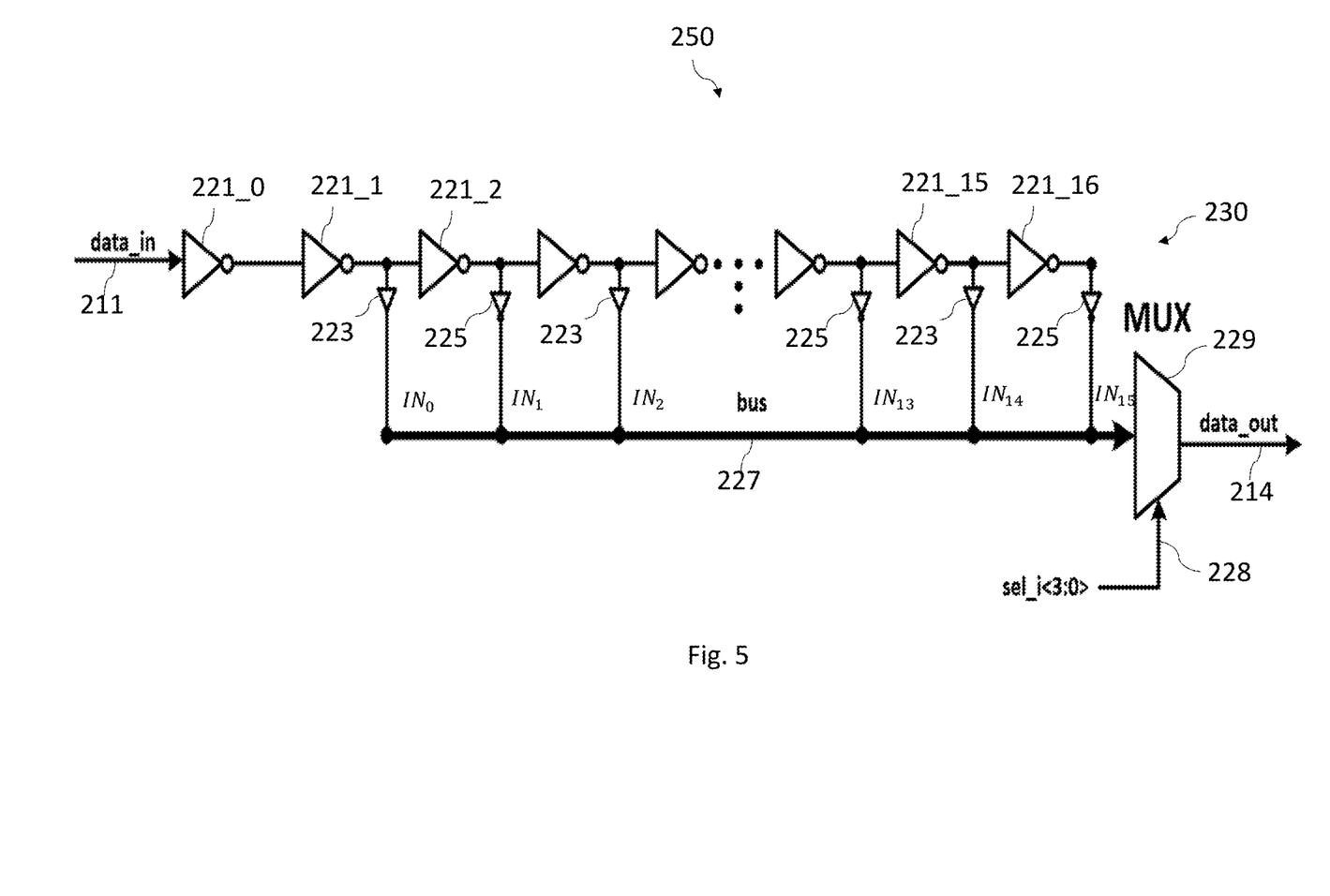
FIG. 5 illustrates a tapped delay line circuit, in an embodiment.

FIG. 5 illustrates a tapped delay line circuit 250, in an embodiment. The tapped delay line circuit 250 includes a tapped delay line 230 and a multiplexer (MUX) 229. In the example of FIG. 5, the tapped delay line 230 includes a plurality of inverters 221 (e.g., 221_0, 221_2, . . . , and 221_16) coupled in series. Each of the inverters 221 introduces a pre-determine amount of delay to the input signal applied at the input terminal 211 of the tapped delay line circuit 250. In FIG. 5, a total of sixteen taps, labeled as IN0, IN1, . . . and IN15, are formed at different delay locations along the tapped delay line 230 (e.g., after the inverters 221_1, 221_2, . . . , and 221_16), thus generating a total of sixteen different delayed versions of the input signal. The sixteen delayed versions of the input signal are sent to the input terminals of the MUX 229 through a data bus 227. A four-bit selection signal sel_i<3:0> applied at a control terminal 228 of the MUX 229 selects one of the delayed versions of the input signal as the output signal at the output terminal 214 of the MUX 229. Note that the input terminal 211 and the output terminal 214 in FIG. 5 correspond to the input terminal 211 and the output terminal 214 of the programmable delay circuit 207 in FIG. 3 (or FIG. 4), respectively. The value of the four-bit selection signal sel_i<3:0> may be determined by the amount of delay calculated by the processing block 220 (see FIGS. 3 or 4) for the corresponding programmable delay circuit 207.

Note that in FIG. 5, an inverter 225 is formed at each of the odd_indexed taps (e.g., IN1, IN3, . . . ), so that the total number of inverters from the input terminal 211 to the odd_indexed tap is an even number. This ensures that the signals outputted at the odd_indexed taps are simply delayed, and are not inverted, when compared to the input signal at the input terminal 211. To match the delay introduced by the inverters 225, logic gates 223 having the same delay as the inverters 225 are formed at the even_indexed taps (e.g., IN0, IN2, . . . ). The logic gate 223 may be, e.g., an AND gate with both input terminals connected together.

The number of taps and the structure of the tapped delay line circuit 250 illustrated in FIG. 5 are for illustration purpose and are not limiting. Other structures or other numbers of taps are also possible and are fully intended to be included within the scope of the present disclosure.

Figure 6:
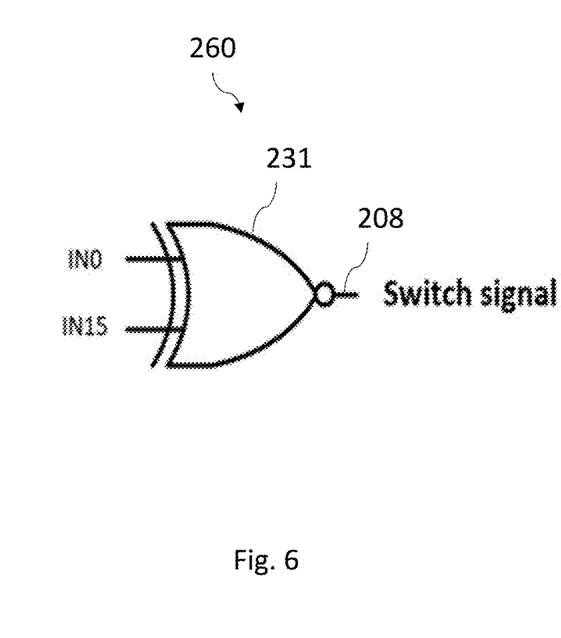
FIG. 6 illustrates a control circuit, in an embodiment.

FIG. 6 illustrates a control circuit 260 for generating the control signal 208, in an embodiment. The control circuit 260 in FIG. 6 is an XNOR gate 231, where a first input terminal of the XNOR gate 231 is coupled to the first tap (e.g., IN0) of the tapped delay line circuit 250, and a second input terminal of the XNOR gate 231 is coupled to the last tap (e.g., IN15) of the tapped delay line circuit 250. When the input signals at the two input terminals are different, the XNOR gate 231 outputs a logic low signal at its output terminal as the control signal 208. When the input signals at the two input terminals are the same, the XNOR gate 231 outputs a logic high signal at its output terminal as the control signal 208. Skilled artisans will readily appreciate that the XNOR gate 231 effectively searches for a rising edge or a falling edge in the input signal applied at the input terminal 211 of the programmable delay circuit 207, and in response to detecting a rising edge or a falling edge, generates the control signal 208 (e.g., having a logic low value) to turn on the switch 205 (e.g., P-type transistor 205 in FIG. 4). Note that once the rising edge or the falling edge of the input signal shifts out of the tapped delay line 230, the output signal (e.g., control signal 208) of the control circuit 260 turns into a logic high value to turn off the switch 205 (e.g., P-type transistor). Therefore, the switch 205 is turned on for a period of time for each rising edge or falling edge detected.

The control circuit 260 of FIG. 6 is designed for the type of switch 205 (e.g., P-type transistor) in FIG. 4. Skilled artisans will readily appreciate that if N-type transistors (instead of P-type transistors) are used as the switches 205, then in response to detecting the rising edge or falling edge in the data signal, the control circuit 260 should generate a logic high value for the control signal 208 to turn on the N-type transistors. This is achieved easily by replacing the XNOR gate 231 of the control circuit 260 with an XOR gate.

Figure 7:
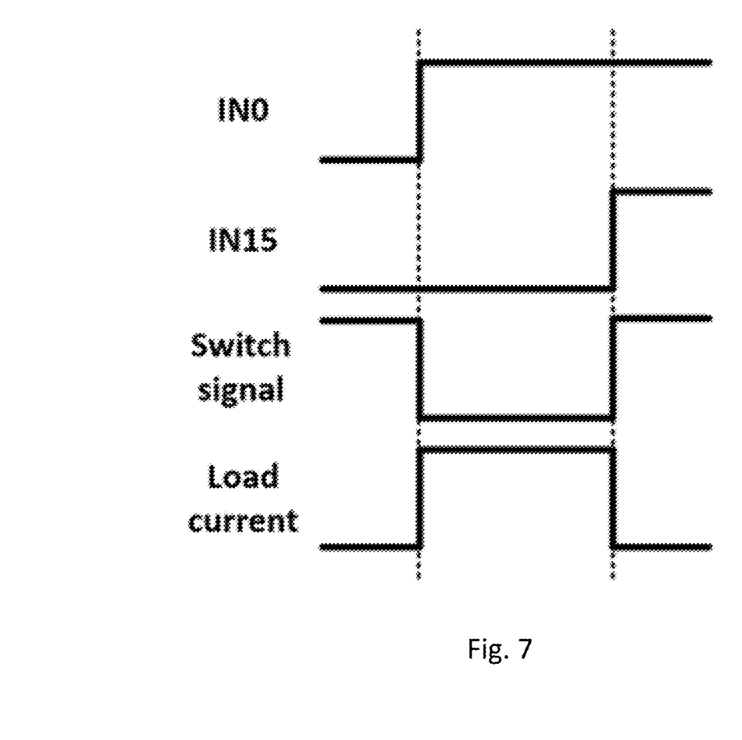
FIG. 7 illustrates input and output signals of the control circuit of FIG. 6, in an embodiment.

FIG. 7 illustrates input and output signals of the control circuit 260 of FIG. 6, in an embodiment. In FIG. 7, the signals at the first tap IN0 and the last tap IN15 of a programmable delay circuit 207B, as well as the corresponding control signal 208 (labeled as Switch signal in FIG. 7) are illustrated. In addition, FIG. 7 illustrates the load current of the programmable delay circuit 207B. As illustrated in FIG. 7, the control signal 208 turns into a logic low value for a period of time when a data transition (e.g., a rising edge) is detected, and the corresponding switch 205 is closed by the control signal 208 to allow a load current to flow into the programmable delay circuit 207.

Figure 8:
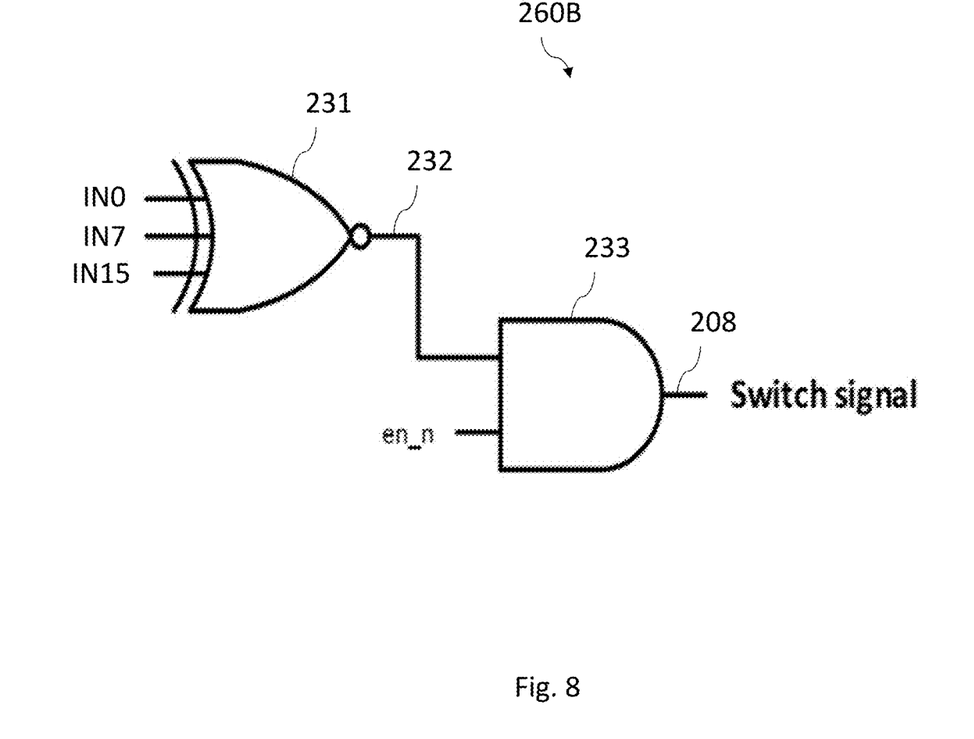
FIG. 8 illustrates a control circuit, in another embodiment.

FIG. 8 illustrates a control circuit 260B for generating the control signal 208, in another embodiment. The control circuit 260B is similar to the control circuit 260, but the XNOR gate 231 has three input terminals coupled to the first tap IN0, the last tap IN15, and a tap between the first tap and the last tap, e.g., a middle tap IN7 of the tapped delay line 230. In addition, the output of the XNOR gate 231 is sent to a first input terminal of an AND gate 233. An enable signal en_n is sent to a second input terminal of the AND gate 233. The output of the AND gate 233 is the control signal 208.

The XNOR gate 231 of the control circuit 260B also searches for a rising edge or a falling edge in the data signal of the programmable delay circuit 207B, but checks at more delay locations (e.g., at the middle tap in addition to the first tap and the last tap) of the tapped delay line 230. Therefore, the control circuit 260B may be used for tapped delay lines 230 having a long delay.

In FIG. 8, when the enable signal en_n has a logic high value, the AND gate 233 opens, and the output of the AND gate 233 is the same as the output of the XNOR gate 231. When the enable signal en_n has a logic low value, the AND gate 233 closes, and the output of the AND gate 233 has a logic low value (which turns on the P-type transistor 205). In some embodiments, the enable signal en_n for all of the control circuits 260B in all of the programmable delay circuits 207B are set to a logic low value, which turns on all of the P-type transistor 205 and allows an electrical current to flow from each of the pass devices 203 into a respective programmable delay circuit 207B. Since all of the switches 205 stay closed (instead of being opened and closed alternately) in this mode of operation, the voltage regulator operates without the dynamic switching of the switches 205.

Figure 9:
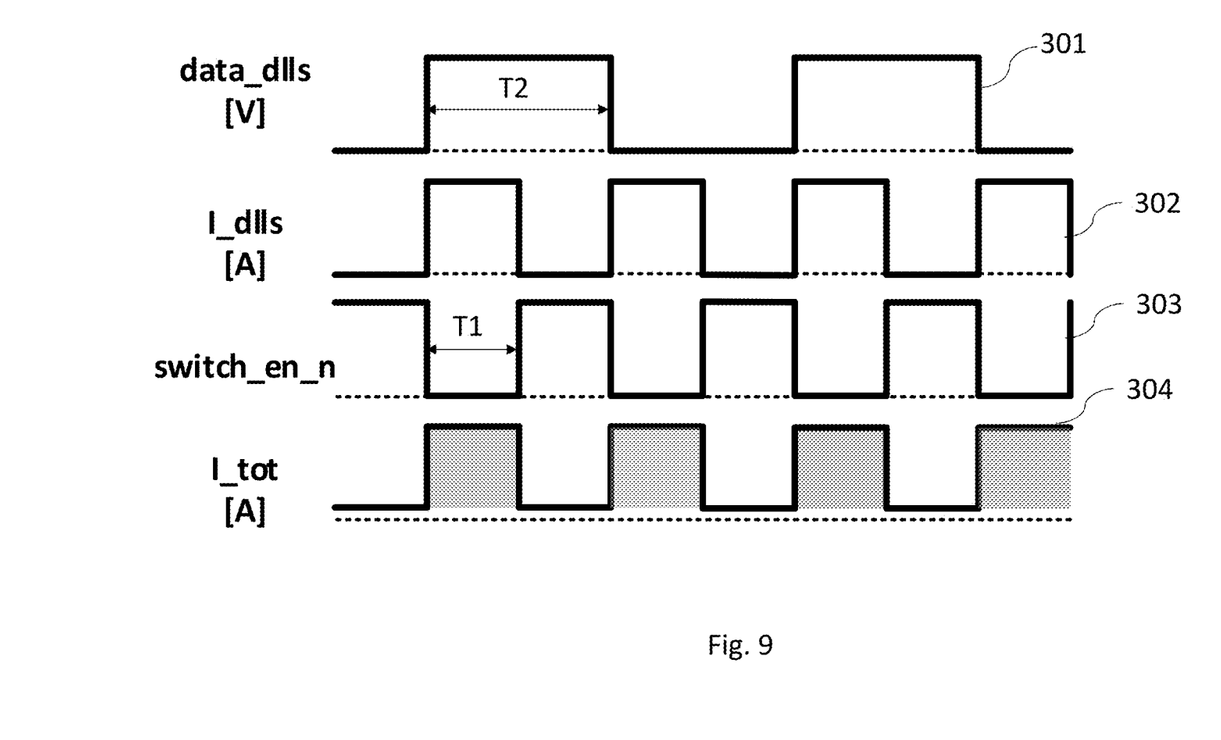
FIG. 9 illustrates various signals of a deskewing circuit, in an embodiment.

FIG. 9 illustrates various signals of the deskewing circuit 300, in an embodiment. In FIG. 9, the signal 301 illustrates the data signal being processed by a programmable delay circuit 207B. The signal 302 illustrates the current flowing from the corresponding pass device 203 into the programmable delay circuit 207B. The signal 303 illustrates the control signal 208 for controlling the corresponding switch 205. The signal 304 shows the total current consumed by the deskewing circuit 300.

As illustrated in FIG. 9, when there is data transition in the data signal, such as a rising edge or a falling edge, the control signal (which is low-active in this example) turns low and closes the switch 205 for a period of time T1, which allows an electrical current to flow through the pass device 203, through the switch 205, and into the programmable delay circuit 207B. The lower flat line of the signal 304 illustrates the current consumption when there is no data transition in the data signal, and the shaded areas in signal 304 show the extra current consumed during data transition. In some embodiments, the period of time T1, which is the width of the enable pulse of the control signal 208, is equal to the length of delay between the first tap (e.g., IN0) and the last tap (e.g., IN15) of the tapped delay line 230. Typically the period of time T1 is shorter than a bit period T2 (e.g., the length of a bit in the data signal) of the data signal.

Figure 10:
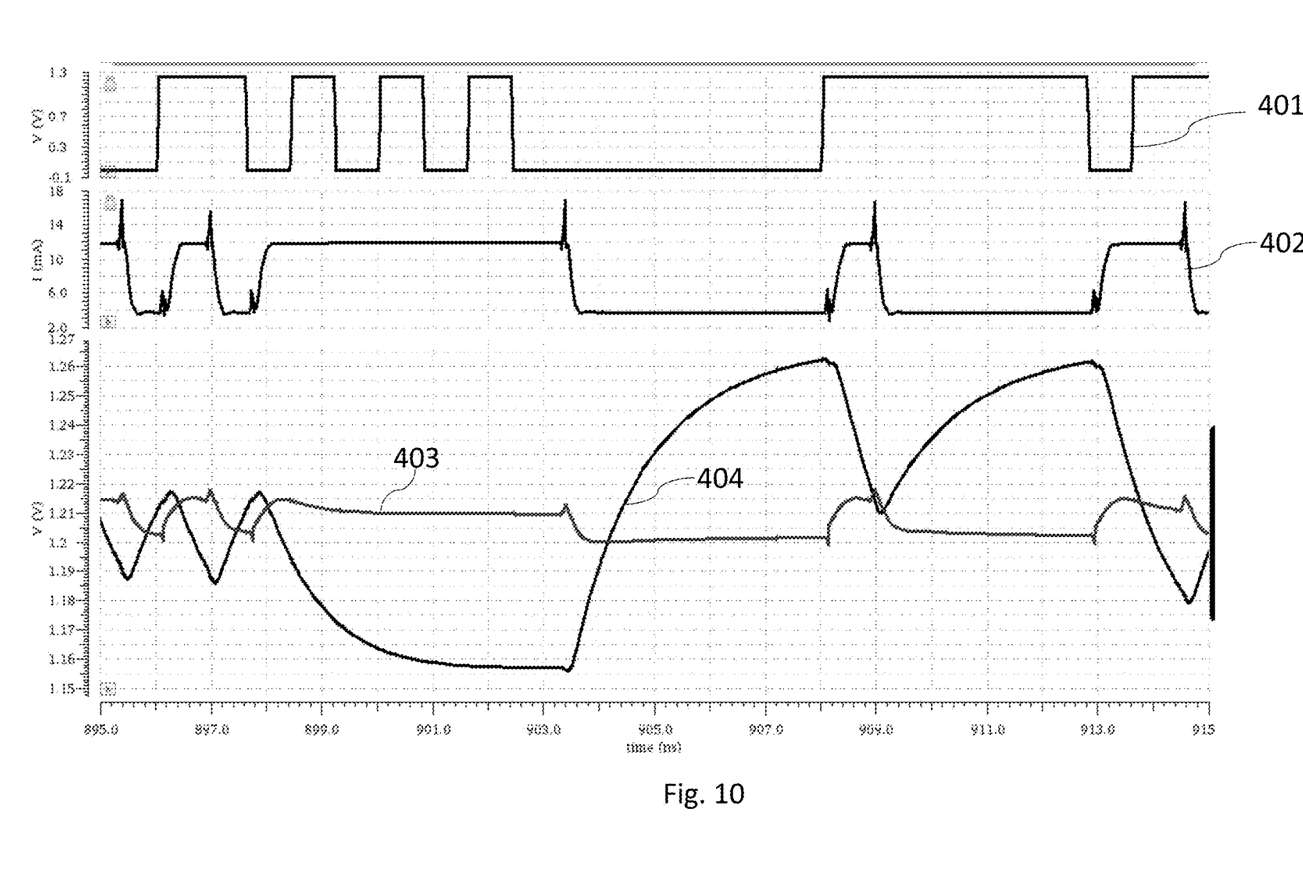
FIG. 10 illustrates the performance of the disclosed deskewing circuit, in an embodiment.

FIG. 10 illustrates the simulated performance of the deskewing circuit 300, in an embodiment. In FIG. 10, the signal 401 illustrates a data signals being processed by a programmable delay circuit 207B. The signal 402 illustrates the load current provided to the programmable delay circuit 207B by the voltage regulator. The signal 403 shows the supply voltage Vout for the programmable delay circuit 207B. For comparison purpose, FIG. 10 also illustrates a signal 404, which is the supply voltage Vout produced by the deskewing circuit 300 when all of the switches 205 remain closed during normal operation of the deskewing circuit 300. Therefore, the signal 404 illustrates the performance without the benefit of dynamic (e.g. on-demand) switching of the switches 205. As illustrated in FIG. 10, the supply voltage Vout illustrated by the signal 404 shows a much larger amplitude variation than the supply voltage Vout illustrated by the signal 403. As discussed above, by supplying currents to the programmable delay circuits 207B dynamically (e.g., on-demand) when data transitions are detected, the integrated voltage regulator in the disclosed deskewing circuit is able to maintain a substantially stable supply voltage Vout, which ensures that the programmable delay circuits 207B provide the correct amount of delays to remove timing skews.

Variations to the disclosed embodiments are possible and are fully intended to be included within the scope of the present disclosure. For example, the switch 205 corresponding to the programmable delay circuits 207A may be replaced by a conductive line (e.g., a copper line), since it remains closed during normal operation of the deskewing circuit. As another example, although the pass device 203 and the switch 205 are implemented as an N-type transistor and a P-type transistor, respectively, in the example of FIG. 4, the pass device 203 and the switch 205 may be implemented using any suitable types (e.g., P-type, N-type) of devices. The control signal 208 may be easily modified to accommodate the type of device used for the switch 205. For instance, if the switch 205 is implemented as an N-type device, then the control circuit 260 (or 260B) may be easily modified to provide a logic high value when data transition is detected, as discussed above. These and other modifications are straightforward for skilled artisans, details are not discussed here.

Figure 11:
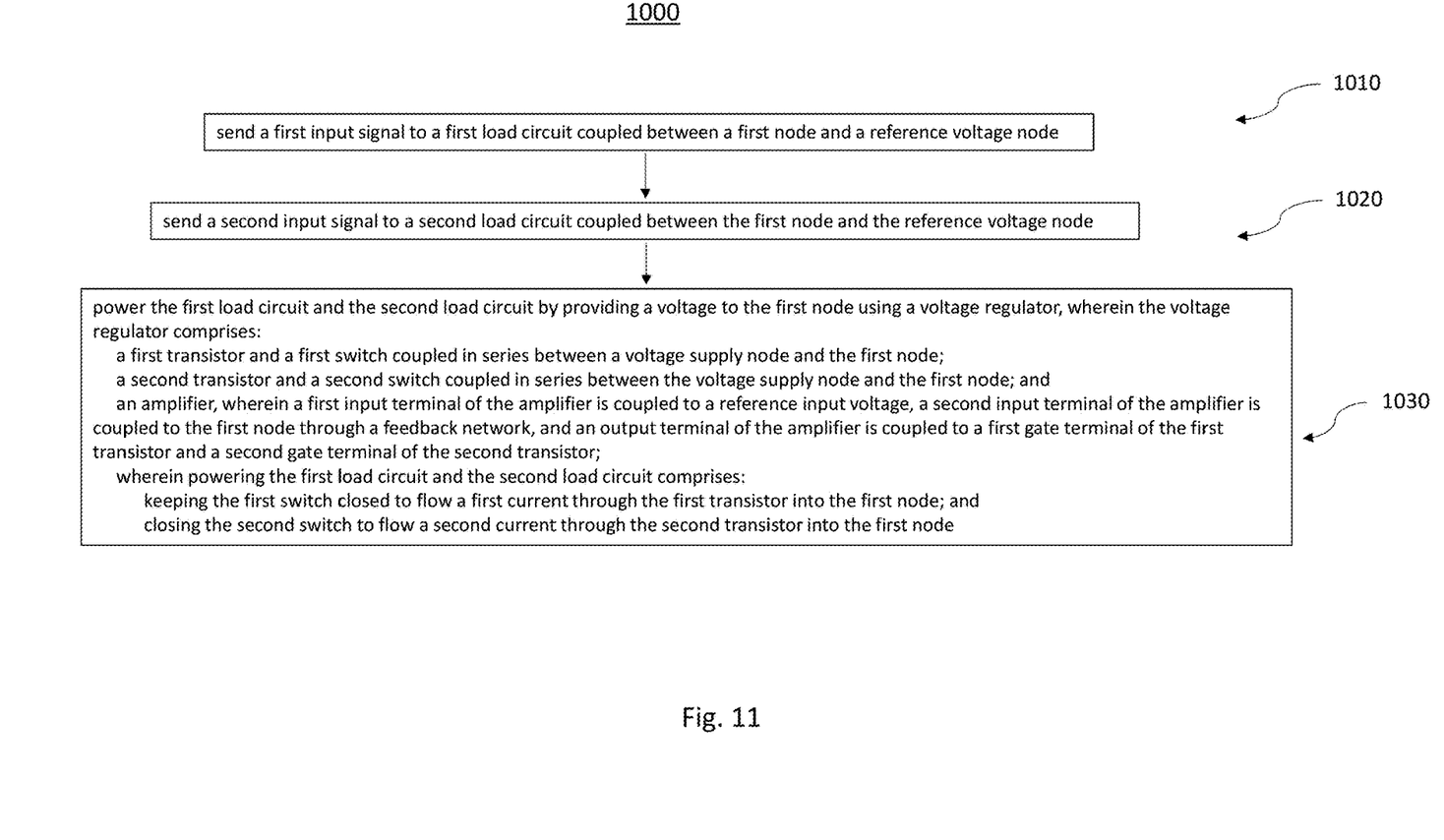
FIG. 11 illustrates a flow chart of a method of operating a deskewing circuit, in some embodiments.

FIG. 11 illustrates a flow chart of a method 1000 of operating a deskewing circuit, in some embodiments. It should be understood that the example method shown in FIG. 11 is merely an example of many possible example methods. One of ordinary skill in the art would recognize many variations, alternatives, and modifications. For example, various steps as illustrated in FIG. 11 may be added, removed, replaced, rearranged, or repeated.

Referring to FIG. 11, at block 1010, a first input signal is sent to a first load circuit coupled between a first node and a reference voltage node. At block 1020, a second input signal is sent to a second load circuit coupled between the first node and the reference voltage node. At block 1030, the first load circuit and the second load circuit are powered by providing a voltage to the first node using a voltage regulator, wherein the voltage regulator comprises: a first transistor and a first switch coupled in series between a voltage supply node and the first node; a second transistor and a second switch coupled in series between the voltage supply node and the first node; and an amplifier, wherein a first input terminal of the amplifier is coupled to a reference input voltage, a second input terminal of the amplifier is coupled to the first node through a feedback network, and an output terminal of the amplifier is coupled to a first gate terminal of the first transistor and a second gate terminal of the second transistor; wherein powering the first load circuit and the second load circuit comprises: keeping the first switch closed to flow a first current through the first transistor into the first node; and closing the second switch to flow a second current through the second transistor into the first node.

Embodiments may achieve advantages as described below. In the disclosed embodiments, the switch 205 is closed dynamically for a period of time (e.g., T1), when a rising edge or a falling edge is detected in the data signal, in order to provide an extra amount of driving current to the programmable delay circuit 207B. The ability to provide driving current on-demand allows the embedded voltage regulator to provide a stable supply voltage Vout for the programmable delay circuit 207B, which ensures that the programmable delay circuit 207B provides the correct amount of delay to remove the timing skews. To further appreciate the advantage of the disclosed embodiments, consider a reference design where the embedded voltage regulator of the deskewing circuit does not perform dynamic switching of the switches 205. The ability of such a reference design to regulate the supply voltage Vout may be limited, e.g., may only work for data signals with frequencies up to a few megahertz (MHz). In contrast, the presently disclosed embodiments are able to regulate the supply voltage Vout for data signals with frequencies up to hundreds of megahertz.

Examples of the present invention are summarized here. Other examples can also be understood from the entirety of the specification and the claims filed herein.

Example 1. In an embodiment, a circuit includes: a first load circuit coupled between a first node and a reference voltage node, wherein an input terminal of the first load circuit is configured to receive a first input signal; a first pass device and a first switch coupled in series between a voltage supply node and the first node; a second load circuit coupled between the first node and the reference voltage node, wherein an input terminal of the second load circuit is configured to receive a second input signal; a second pass device and a second switch coupled in series between the voltage supply node and the first node; and an amplifier, wherein a first input terminal of the amplifier is configured to be coupled to a reference input voltage, and a second input terminal of the amplifier is coupled to the first node through a feedback network, wherein an output terminal of the amplifier is coupled to a first control terminal of the first pass device and a second control terminal of the second pass device.

Example 2. The circuit of Example 1, wherein the first pass device and the second pass device are transistors, wherein the first control terminal and the second control terminal are gate terminals of the transistors.

Example 3. The circuit of Example 1 or 2, wherein the amplifier is an operational amplifier, wherein the first input terminal of the operational amplifier is a positive terminal of the operational amplifier, and the second input terminal of the operational amplifier is a negative terminal of the operational amplifier.

Example 4. The circuit of Example 1 or 2, wherein the first switch is configured to stay closed during normal operation of the circuit, and the second switch is configured to be opened and closed alternately during the normal operation of the circuit.

Example 5. The circuit of Example 4, wherein during the normal operation of the circuit, the second switch is configured to be closed by a control signal for a period of time when a rising edge or a falling edge is detected in the second input signal.

Example 6. The circuit of Example 5, wherein at the rising edge or the falling edge of the second input signal, there is an increase in a load current consumed by the second load circuit.

Example 7. The circuit of Example 1 or 2, wherein the first load circuit is a first programmable delay circuit comprising a first tapped delay line circuit, wherein an input terminal of the first programmable delay circuit is configured to receive a clock signal, wherein the second load circuit is a second programmable delay circuit comprising a second tapped delay line circuit, wherein an input terminal of the second programmable delay circuit is configured to receive a data signal.

Example 8. The circuit of Example 7, wherein each of the first tapped delay line circuit and the second tapped delay line circuit comprises: a tapped delay line having a plurality of taps at different delay locations along the tapped delay line; and a multiplexer, wherein input terminals of the multiplexer are coupled to the plurality of taps of the tapped delay line, wherein the multiplexer is configured to output an input signal at one of the input terminals selected by a selection signal of the multiplexer.

Example 9. The circuit of Example 8, wherein the second programmable delay circuit further comprises a control circuit configured to generate a control signal for opening or closing the second switch during normal operation of the circuit.

Example 10. The circuit of Example 9, wherein the first switch is configured to stay closed during the normal operation of the circuit.

Example 11. The circuit of Example 9, wherein the control circuit of the second programmable delay circuit is configured to: detect a rising edge or a falling edge in the data signal; and in response to detecting the rising edge or the falling edge, generate the control signal to close the second switch for a period of time.

Example 12. In an embodiment, a circuit includes a voltage regulator that includes: a first transistor and a first switch coupled in series between a voltage supply node and a first node; a second transistor and a second switch coupled in series between the voltage supply node and the first node; and an amplifier, wherein a first input terminal of the amplifier is configured to be coupled to a reference input voltage, and a second input terminal of the amplifier is coupled to the first node through a feedback network, wherein an output terminal of the amplifier is coupled to a first gate terminal of the first transistor and a second gate terminal of the second transistor. The circuit further includes a first load circuit coupled between the first node and a reference voltage node; and a second load circuit coupled between the first node and the reference voltage node, wherein the voltage regulator is configured to, during normal operation of the circuit, open and close the second switch repeatedly in accordance with a load condition of the second load circuit.

Example 13. The circuit of Example 12, wherein the voltage supply node is configured to be coupled to a supply voltage, and the reference voltage node is configured to be coupled to electrical ground.

Example 14. The circuit of Example 12, wherein the first switch is configured to stay closed during the normal operation of the circuit.

Example 15. The circuit of Example 12 or 14, wherein during the normal operation of the circuit, a load of the second load circuit changes between a first value and a second value higher than the first value, wherein the voltage regulator is configured to: close the second switch for a period of time when the load of the second load circuit increases from the first value to the second value; and open the second switch when the load of the second load circuit is at the first value.

Example 16. The circuit of Example 12, wherein the first load circuit is a first programmable delay circuit configured to receive a clock signal, wherein the second load circuit is a second programmable delay circuit configured to receive a data signal clocked by the clock signal, wherein the first programmable delay circuit is configured to delay the clock signal by a first amount of time, and the second programmable delay circuit is configured to delay the data signal by a second amount of time to reduce a timing skew between the clock signal and the data signal.

Example 17. The circuit of Example 16, wherein the voltage regulator is configured to: close the second switch for a period of time when a rising edge or a falling edge is detected in the data signal.

Example 18. In an embodiment, a method of operating a circuit includes: sending a first input signal to a first load circuit coupled between a first node and a reference voltage node; sending a second input signal to a second load circuit coupled between the first node and the reference voltage node; and powering the first load circuit and the second load circuit by providing a voltage to the first node using a voltage regulator, wherein the voltage regulator comprises: a first transistor and a first switch coupled in series between a voltage supply node and the first node; a second transistor and a second switch coupled in series between the voltage supply node and the first node; and an amplifier, wherein a first input terminal of the amplifier is coupled to a reference input voltage, a second input terminal of the amplifier is coupled to the first node through a feedback network, and an output terminal of the amplifier is coupled to a first gate terminal of the first transistor and a second gate terminal of the second transistor; wherein powering the first load circuit and the second load circuit comprises: keeping the first switch closed to flow a first current through the first transistor into the first node; and closing the second switch to flow a second current through the second transistor into the first node.

Example 19. The method of Example 18, wherein closing the second switch comprises: detecting a rising edge or a falling edge in the second input signal; and in response to detecting the rising edge or the falling edge, closing the second switch for a period of time.

Example 20. The method of Example 19, further comprising, after closing the second switch for the period of time, opening the second switch.

While this invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

What is claimed is:

1. A circuit comprising:
a first load circuit coupled between a first node and a reference voltage node, wherein an input terminal of the first load circuit is configured to receive a first input signal;
a first transistor coupled between a voltage supply node and the first node;
a second load circuit coupled between the first node and the reference voltage node, wherein an input terminal of the second load circuit is configured to receive a second input signal;
a second transistor and a second switch coupled in series between the voltage supply node and the first node; and
an amplifier, wherein a first input terminal of the amplifier is configured to be coupled to a reference input voltage, and a second input terminal of the amplifier is coupled to the first node through a feedback network, wherein an output terminal of the amplifier is coupled to a first gate terminal of the first transistor and a second gate terminal of the second transistor, wherein the second switch is configured to be opened and closed alternately during normal operation of the circuit, wherein during the normal operation of the circuit, the second switch is configured to be closed by a control signal for a period of time when a rising edge or a falling edge is detected in the second input signal.

2. The circuit of claim 1, wherein the amplifier is an operational amplifier, wherein the first input terminal of the operational amplifier is a positive terminal of the operational amplifier, and the second input terminal of the operational amplifier is a negative terminal of the operational amplifier.

3. The circuit of claim 1, further comprising a first switch, wherein the first transistor and the first switch are coupled in series between the voltage supply node and the first node, wherein the first switch is configured to stay closed during the normal operation of the circuit.

4. The circuit of claim 1, wherein at the rising edge or the falling edge of the second input signal, there is an increase in a load current consumed by the second load circuit.

5. The circuit of claim 1, wherein the first load circuit is a first programmable delay circuit comprising a first tapped delay line circuit, wherein an input terminal of the first programmable delay circuit is configured to receive a clock signal, wherein the second load circuit is a second programmable delay circuit comprising a second tapped delay line circuit, wherein an input terminal of the second programmable delay circuit is configured to receive a data signal.

6. The circuit of claim 5, wherein each of the first tapped delay line circuit and the second tapped delay line circuit comprises:
a tapped delay line having a plurality of taps at different delay locations along the tapped delay line; and
a multiplexer, wherein input terminals of the multiplexer are coupled to the plurality of taps of the tapped delay line, wherein the multiplexer is configured to output an input signal at one of the input terminals selected by a selection signal of the multiplexer.

7. The circuit of claim 6, wherein the second programmable delay circuit further comprises a control circuit configured to generate the control signal for opening or closing the second switch during the normal operation of the circuit.

8. The circuit of claim 7, wherein the control circuit of the second programmable delay circuit is configured to:
detect a rising edge or a falling edge in the data signal; and
in response to detecting the rising edge or the falling edge, generate the control signal to close the second switch for a period of time.

9. The circuit of claim 1, wherein a first load path terminal of the first transistor is directly coupled to the voltage supply node, and a second load path terminal of the first transistor is directly coupled to the first node.

10. A circuit comprising:
a voltage regulator comprising:
a first transistor coupled between a voltage supply node and a first node;
a second transistor and a second switch coupled in series between the voltage supply node and the first node; and
an amplifier, wherein a first input terminal of the amplifier is configured to be coupled to a reference input voltage, and a second input terminal of the amplifier is coupled to the first node through a feedback network, wherein an output terminal of the amplifier is coupled to a first gate terminal of the first transistor and a second gate terminal of the second transistor;
a first load circuit coupled between the first node and a reference voltage node; and
a second load circuit coupled between the first node and the reference voltage node, wherein the voltage regulator is configured to, during normal operation of the circuit, open and close the second switch repeatedly in accordance with a load condition of the second load circuit, wherein the first load circuit is a first programmable delay circuit configured to receive a clock signal, wherein the second load circuit is a second programmable delay circuit configured to receive a data signal clocked by the clock signal, wherein the voltage regulator is configured to close the second switch for a period of time when a rising edge or a falling edge is detected in the data signal.

11. The circuit of claim 10, wherein the voltage supply node is configured to be coupled to a supply voltage, and the reference voltage node is configured to be coupled to electrical ground.

12. The circuit of claim 10, further comprising a first switch, wherein the first transistor and the first switch are coupled in series between the voltage supply node and the first node, wherein the first switch is configured to stay closed during the normal operation of the circuit.

13. The circuit of claim 12, wherein during the normal operation of the circuit, a load of the second load circuit changes between a first value and a second value higher than the first value, wherein the voltage regulator is configured to:
close the second switch for a period of time when the load of the second load circuit increases from the first value to the second value; and
open the second switch when the load of the second load circuit is at the first value.

14. The circuit of claim 10, wherein the first programmable delay circuit is configured to delay the clock signal by a first amount of time, and the second programmable delay circuit is configured to delay the data signal by a second amount of time to reduce a timing skew between the clock signal and the data signal.

15. A method of operating a circuit, the method comprising:
sending a first input signal to a first load circuit coupled between a first node and a reference voltage node;
sending a second input signal to a second load circuit coupled between the first node and the reference voltage node; and
powering the first load circuit and the second load circuit by providing a voltage to the first node using a voltage regulator, wherein the voltage regulator comprises:
a first transistor coupled between a voltage supply node and the first node;
a second transistor and a second switch coupled in series between the voltage supply node and the first node; and
an amplifier, wherein a first input terminal of the amplifier is coupled to a reference input voltage, a second input terminal of the amplifier is coupled to the first node through a feedback network, and an output terminal of the amplifier is coupled to a first gate terminal of the first transistor and a second gate terminal of the second transistor;
wherein powering the first load circuit and the second load circuit comprises:
flowing a first current through the first transistor into the first node; and
opening and closing the second switch alternately during normal operation of the circuit to flow a second current through the second transistor into the first node, wherein the second switch is configured to be closed by a control signal for a period of time when a falling edge or a rising edge is detected in the second input signal.

16. The method of claim 15, wherein the first load circuit is a first programmable delay circuit comprising a first tapped delay line circuit, and the first input signal is a clock signal sent to an input terminal of the first programmable delay circuit, wherein the second load circuit is a second programmable delay circuit comprising a second tapped delay line circuit, and the second input signal is a data signal sent to an input terminal of the second programmable delay circuit.

17. The method of claim 16, wherein the second programmable delay circuit further comprises a control circuit configured to generate the control signal.

18. The method of claim 17, wherein each of the first tapped delay line circuit and the second tapped delay line circuit comprises:
a tapped delay line having a plurality of taps at different delay locations along the tapped delay line; and
a multiplexer, wherein input terminals of the multiplexer are coupled to the plurality of taps of the tapped delay line, wherein the multiplexer is configured to output an input signal at one of the input terminals selected by a selection signal of the multiplexer,
wherein the control circuit comprises a logic gate, wherein a first input terminal of the logic gate is coupled to a leftmost tap of the second programmable delay circuit, and a second input terminal of the logic gate is coupled to a rightmost tap of the second programmable delay circuit.

19. The method of claim 15, wherein the voltage regulator further comprises a first switch, wherein the first transistor and the first switch are coupled in series between the voltage supply node and the first node, wherein flowing the first current comprises keeping the first switch closed during the normal operation of the circuit.

20. The method of claim 15, wherein a first load path terminal of the first transistor is directly coupled to the voltage supply node, and a second load path terminal of the first transistor is directly coupled to the first node.

\* \* \* \* \*